United States Patent
Makimoto et al.

[11] Patent Number: 6,153,493
[45] Date of Patent: Nov. 28, 2000

[54] METHOD OF MANUFACTURING SEMICONDUCTOR DEVICE

[75] Inventors: Hiromi Makimoto; Moriyoshi Nakashima; Kojiro Yuzuriha; Makoto Ooi; Jun Sumino, all of Hyogo, Japan

[73] Assignee: Mitsubishi Denki Kabushiki Kaisha, Tokyo, Japan

[21] Appl. No.: 09/116,880

[22] Filed: Jul. 16, 1998

[30] Foreign Application Priority Data

Jan. 28, 1998 [JP] Japan .................................. 10-015925

[51] Int. Cl.[7] .................................................. H01L 21/76
[52] U.S. Cl. ........................ 438/410; 438/400; 438/404
[58] Field of Search ................................. 438/410, 404, 438/400

[56] References Cited

U.S. PATENT DOCUMENTS

| 5,103,273 | 4/1992 | Gill et al. ............................. 357/23.5 |
| 5,252,511 | 10/1993 | Bhan et al. .............................. 437/70 |
| 5,338,968 | 8/1994 | Hodges et al. ......................... 257/647 |
| 5,397,733 | 3/1995 | Jang ........................................... 437/69 |
| 5,447,885 | 9/1995 | Cho et al. ................................. 437/70 |
| 5,472,905 | 12/1995 | Paek et al. . |
| 5,508,541 | 4/1996 | Hieda et al. ............................. 257/301 |
| 5,543,343 | 8/1996 | Bryant et al. ............................. 437/51 |
| 5,668,403 | 9/1997 | Kunikiyo ................................. 257/639 |
| 5,792,687 | 8/1998 | Jeng et al. ............................... 438/253 |
| 5,942,779 | 8/1999 | Okita ....................................... 257/315 |

FOREIGN PATENT DOCUMENTS 4-234146  8/1992  Japan .

*Primary Examiner*—Matthew Smith
*Assistant Examiner*—Granvill D. Lee, Jr.
*Attorney, Agent, or Firm*—McDermott, Will & Emery

[57] ABSTRACT

A field oxide film which is fine and having smaller upheaval of a bird's head is formed, so as to improve electrical characteristic of a conductive layer formed with end portions positioned on the field oxide film. A planarizing silicon film is formed on a silicon nitride film and a thermal oxide film, so as to planarize a concave generated between the thermal oxide film and a silicon nitride film. The planarizing silicon film is thermally oxidized, so as to form a planarizing thermal oxide film integrated with the thermal oxide film. Thereafter, the planarizing thermal oxide film is etched back to form the field oxide film, and the silicon nitride film and a polycrystalline silicon film are removed. Thereafter, the conductive layer with end portions positioned on the field oxide film is formed.

10 Claims, 12 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device and, more particularly, to a method of manufacturing a semiconductor device in which semiconductor elements are formed on a semiconductor substrate having element isolating regions provided by a field oxide film.

2. Description of the Background Art

LOCOS (Local Oxidation of Silicon) method has been used as a method of forming a field oxide film. Japanese Patent Laying-Open No. 4-234146, for example, discloses the conventional LOCOS method applied to a process for forming an element isolating insulating film in a DRAM (Dynamic Random Access Memory). One example of the method of forming a field oxide film by the conventional typical LOCOS method described in this laid-open application, for example, will be described with reference to FIGS. 14 to 18.

In the method of forming the field oxide film by the conventional LOCOS method, first, referring to FIG. 14, a silicon oxide film 102 having a thickness $T_1$ of 100Å to 300Å is formed on a silicon substrate 101. Thereafter, a polycrystalline silicon film (or an amorphous silicon film) 103 having the thickness of 300Å to 700Å is formed on silicon oxide film 102. Further, a silicon nitride film 104 is formed on polycrystalline silicon film 103. A resist 105 is patterned, and anisotropic etching is performed as shown in FIG. 15, so that silicon oxide film 102 is exposed. Thereafter, resist 105 is removed. Referring to FIG. 16, the exposed oxide film is further oxidized by thermal oxidation, for example, to form a field oxide film locally having a large thickness $T_2$ of 5000Å to 6000Å. Thereafter, referring to FIG. 17, silicon nitride film 104 and polycrystalline film 103 are removed. When a flash memory, for example, is to be formed on silicon substrate 101 including field oxide film 110 formed in this manner, a conductive layer 108 which will be a floating gate electrode is formed with an end portion 108 positioned on field oxide film 110, as shown in FIG. 18. Thereafter, referring to FIG. 19, an ONO (Oxide-Nitride-Oxide) film 114 providing inter-electrode multi-layered insulation film is formed to cover the surface of conductive layer 108 and, a conductive layer 115 which is to be the control gate electrode is formed further thereon. Thereafter, an interlayer insulating film 116 and a bit line 117 are formed further thereon, whereby a flash memory such as shown in FIGS. 20A, 20B and 20C is completed.

However, the method of forming an element isolating insulating film by the LOCOS method suffers from the following problem.

In the method of forming field oxide film 110 by the LOCOS method, it is necessary to increase thickness of silicon nitride film 104 in order to suppress a bird's beak 110b formed below silicon nitride film 104 near an edge of an opening 120, as shown in FIG. 16. This results in a large concave at a region 111 between oxide film 102a(thickness: $T_1$) deposited thin and a bird's head 110a of field oxide film 110 which is made very thick to maximum thickness of $T_2$ by thermal oxidation.

Accordingly, when conductive layer 108 for the electrode is formed having end portions 108 positioned on silicon oxide film 102a and field oxide film 110 as shown in FIG. 18, end portion 108a of conductive layer 108 for the electrode extends upward along a steep inclination near the region 111, and hence end portion 108a of conductive layer 108 protrudes with a sharp angle. This may possibly cause electric field concentration at end portion 108a of conductive layer 108, resulting in dielectric breakdown and emission of charges in conductive layer 108 from end portion 108a. As a result, application of such conductive layer 108 to the floating gate electrode of a flash memory shown in FIGS. 20A to 20C, for example may possibly lead to a problem of degraded charge retention characteristic.

SUMMARY OF THE INVENTION

An object of the present invention is to provide a method of manufacturing a semiconductor device in which formation of a steep inclination between the bird's head and a bird's beak of the field oxide film and protrusion of an end portion of a conductive layer for forming an electrode having the end portion positioned on the field oxide film extending upward with steep angle are suppressed, so that electric field concentration at this portion is relaxed and charge retention characteristic of the conductive layer for forming the electrode is improved.

The above described object of the present invention is attained by the method of manufacturing a semiconductor device in accordance with one aspect of the present invention, which includes the following steps.

First, a silicon oxide film is formed on a silicon substrate, and a polycrystalline silicon film is formed on the silicon oxide film. A silicon nitride film is formed on the polycrystalline silicon film, and a resist which is patterned to have an opening at a prescribed region on silicon nitride film is formed. Using the resist as a mask, the polycrystalline silicon film and a silicon nitride film are etched, so as to form an opening in the polycrystalline silicon film and the silicon nitride film at the aforementioned prescribed region, whereby the silicon oxide film at the prescribed region is exposed. The exposed portion of the silicon oxide film is thermally oxidized to form a thermal oxide film upheaved at the prescribed region. Thereafter, on the silicon nitride film and the thermal oxide film, a silicon film for planarization is formed of polycrystalline silicon or amorphous silicon, so as to fill and planarize the concave generated between the thermal oxide film and the silicon nitride film. Thereafter, the planarizing silicon film is thermally oxidized to be integrated with the thermal oxide film, and thus a planarizing thermal oxide film is formed. Thereafter, the planarizing thermal oxide film is etched back until all wall surfaces of the opening of the silicon nitride film are exposed, a field oxide film is formed, and thereafter, the silicon nitride film and a polycrystalline silicon film are removed. Thereafter, a conductive layer having an end portion positioned on the field oxide film is formed.

The method of manufacturing the semiconductor device including the above described steps provides the following effects. Since the planarizing thermal oxide film is, as a whole, formed of a silicon oxide film, it is possible to set etching condition such that etch selectivity in etch back of this film is higher than that for the silicon nitride film. By the etch back under such condition, it is possible to remove the planarizing thermal oxide film substantially without removing the silicon nitride film when etching is continued after part of the surface of the silicon nitride film is exposed. Accordingly, flatter filed oxide film without a step is formed. As a result, different from the prior art, that end portion of the conductive layer formed thereon which is positioned on the field oxide film does not extend upward along the step. Therefore, it becomes possible to form the conductive layer with its end portion not forming an acute angle. Thus electric field concentration at the end portion of the conductive layer is relaxed.

When the manufacturing method is applied to formation of a floating gate electrode of a flash memory, for example, volatile reduction of stored charges caused by dielectric breakdown is suppressed, as electric concentration at the end portion is relaxed. Therefore, a memory element having stable electrical characteristic can be provided, even when the electrode is made very fine with extremely narrow width.

According to another aspect, the method of manufacturing the semiconductor device in accordance with the present invention includes the following steps.

First, a silicon oxide film is formed on a silicon substrate, and a polycrystalline silicon film is formed on the silicon oxide film. Thereafter, a silicon nitride film is formed on the polycrystalline silicon film, and a resist patterned to have an opening on a prescribed region of the silicon oxide film is formed. Using the resist as a mask, the polycrystalline silicon film and silicon nitride film are etched, so that an opening is formed in the polycrystalline silicon film and a silicon nitride film in the aforementioned prescribed region, and the silicon oxide film at the prescribed region is exposed. Thereafter, the exposed portion of the silicon oxide film is thermally oxidized, so as to form a thermal oxidation film upheaved at the prescribed region. Thereafter, a planarizing oxide film is deposited on the silicon nitride film and the thermal oxide film, so as to fill and planarize the concave generated between the silicon nitride film and the thermal oxide film. Thereafter, the planarizing oxide film and the thermal oxide film are etched back until all wall surfaces of the opening of the silicon nitride film are exposed, when a field oxide film is formed. Thereafter, the silicon nitride film and the polycrystalline silicon film are removed, and a conductive layer having an end portion positioned on the field oxide film is formed.

In the manufacturing method, preferably, CVD method is utilized in the step of depositing the planarizing oxide film.

According to the method of manufacturing a semiconductor device in accordance with the present invention in which the semiconductor device is formed through the above described process steps, the thermal oxide film and the planarizing oxide film are both of silicon oxide, and therefore it is possible to set etching condition such that etch selectivity in etch back of the oxide films is made higher than that for the silicon nitride film. Etch back under such etching condition enables removal of the planarizing thermal oxide film and the thermal oxide film substantially without removing the silicon nitride film, when etching is continued after part of the surface of the silicon nitride film is exposed. Therefore, similar to the method in accordance with the first aspect, flatter field oxide film without a step is formed. As a result, different from the prior art, that end portion of the conductive layer formed thereon which is positioned on the field oxide film does not extend upward along the step. Accordingly, it is possible to form the conductive layer with the end portion not forming an acute angle, and hence it is possible to relax electric field concentration at the end portion of the conductive layer.

When the manufacturing method is applied to forming a floating gate electrode of a flash memory, for example, similar effects as in the first aspect can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described with reference to FIGS. 1 to 12.

FIRST EMBODIMENT

The method of manufacturing a semiconductor device in accordance with the first embodiment of the present invention will be described with reference to FIGS. 1 to 9.

Figure 1:
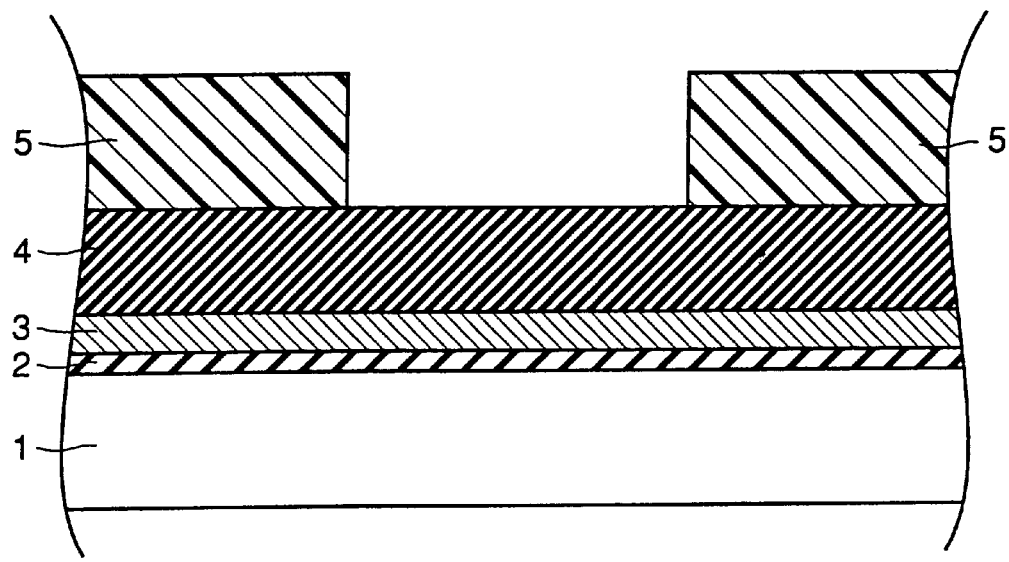
FIG. 1 is a cross section showing a state immediately after formation of a resist 5 having a prescribed pattern, in accordance with the method of manufacturing a semiconductor device in accordance with a first embodiment of the present invention.
Figure 2:
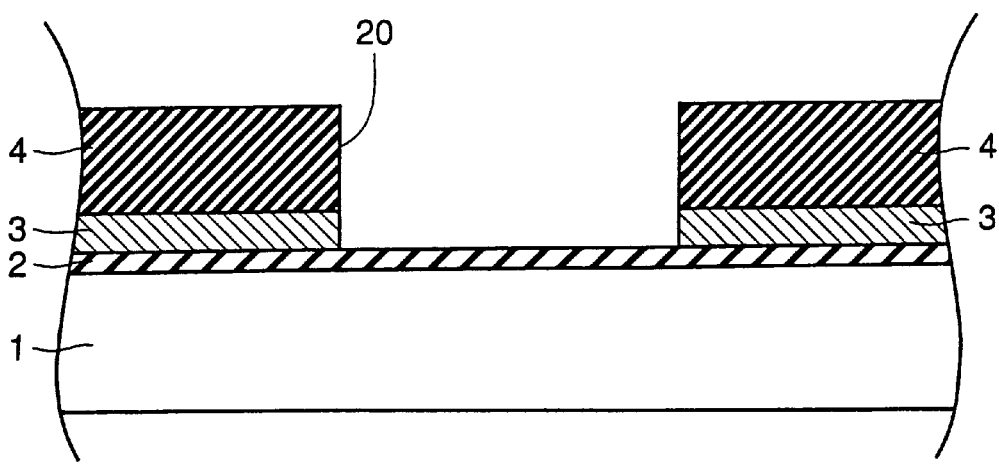
FIG. 2 is a cross section showing a state immediately after etching silicon oxide film 3 and silicon nitride film 4 in the method of manufacturing a semiconductor device in accordance with the first embodiment of the present invention.

In the method of manufacturing a semiconductor device in accordance with the first embodiment, first, referring to FIG. 1, a silicon oxide film 2 is formed on a silicon substrate. Thereafter, a polycrystalline silicon film 3 is formed on silicon oxide film 2, and a silicon nitride film 4 is formed on polycrystalline silicon film 3. Thereafter, a resist 5 patterned to a prescribed shape is formed on silicon nitride film 4, polycrystalline silicon film 3 and silicon nitride film 4 are etched using resist 5 as a mask, whereby an opening 20 is provided, through which silicon oxide film 2 is exposed, as shown in FIG. 2.

Figure 3:
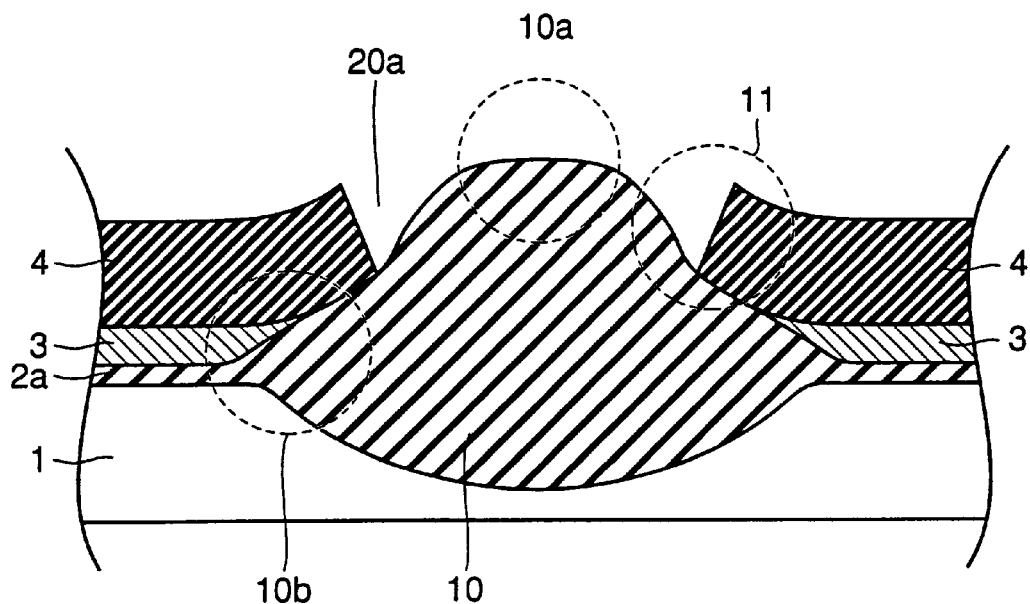
FIG. 3 is a cross section showing a state immediately after formation of thermal oxide film 10 by thermal oxidation of an exposed silicon oxide film, in the method of manufacturing a semiconductor device in accordance with the first embodiment of the present invention.
Figure 4:
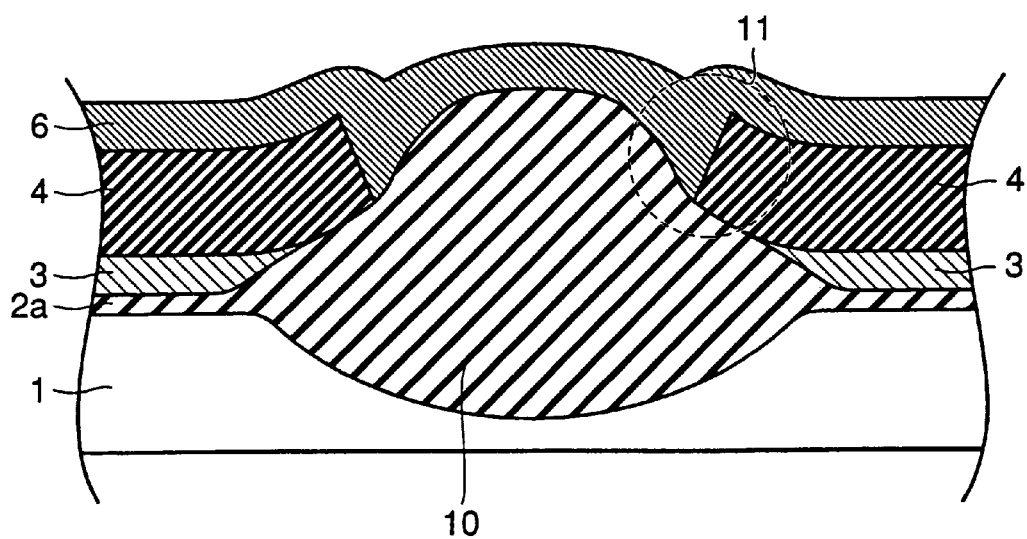
FIG. 4 is a cross section showing a state immediately after formation of a polycrystalline silicon film 6 for planarization, in the method of manufacturing a semiconductor device in accordance with the first embodiment of the present invention.
Figure 5:
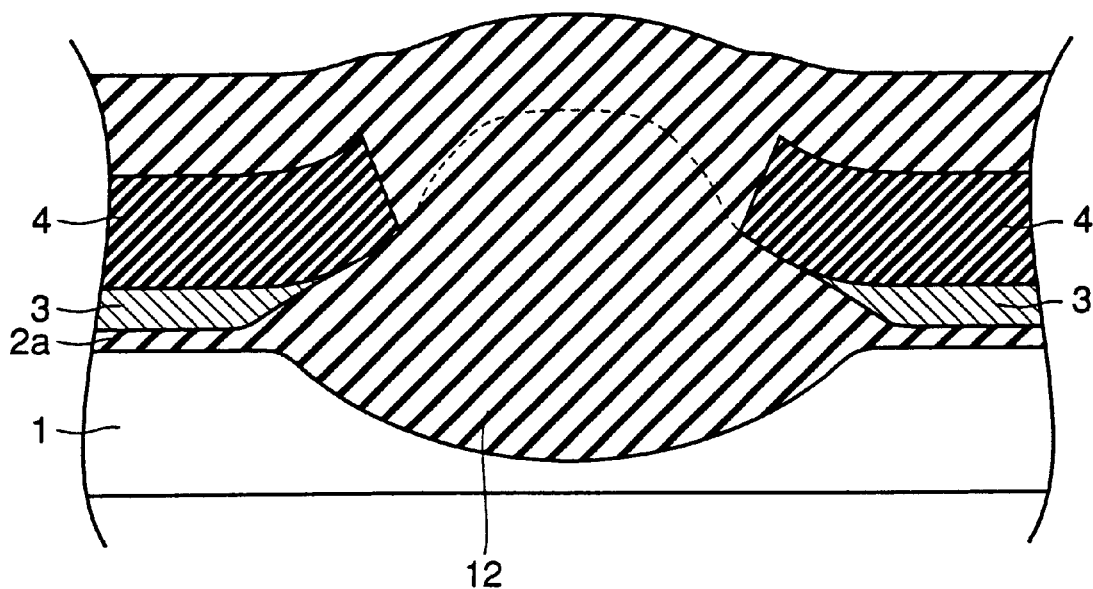
FIG. 5 is a cross section showing a state immediately after formation of a planarizing thermal oxide film 12 by thermally oxidizing polycrystalline silicon film 6, in the method of manufacturing a semiconductor device in accordance with the first embodiment of the present invention.

Thereafter, referring to FIG. 3, the exposed portion of silicon oxide film 2 is thermally oxidized, so that a thermal oxide film 10 having a so-called bird's head 10a is formed in opening 20 of silicon nitride film 4. At this time, bird's beaks 10b are generated below silicon nitride film 4 at the edge of opening 20. Thereafter, referring to FIG. 4, a polycrystalline silicon film 6 is formed on silicon nitride film 4 and field oxide film 10, so as to planarize a concave portion 20a resulting from a step between silicon nitride film 4 and thermal oxide film 10. Further, as shown in FIG. 5, planarizing polycrystalline silicon film 6 is thermally oxidized, so as to form planarizing thermal oxide film 12 integral with the thermal oxide film 10. At this time, bird's beak 10b extends by about 0.01 to 0.02 μm because of the influence of re-thermal oxidation. However, extension of bird's beak 10b in this range can be canceled simply by changing exposure time in photolithography in patterning resist 5, for example, and hence such extension does not cause any substantial problem.

Figure 6:
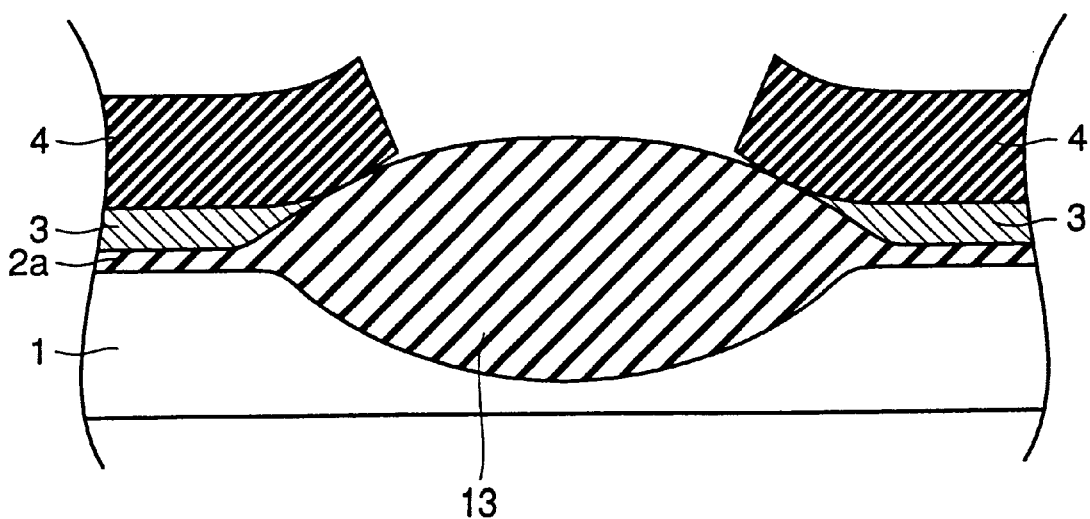
FIG. 6 is a cross section showing a state immediately after formation of a field oxide film 13 by etching back planarizing thermal oxide film 12, in the method of manufacturing a semiconductor device in accordance with the first embodiment of the present invention.
Figure 7:
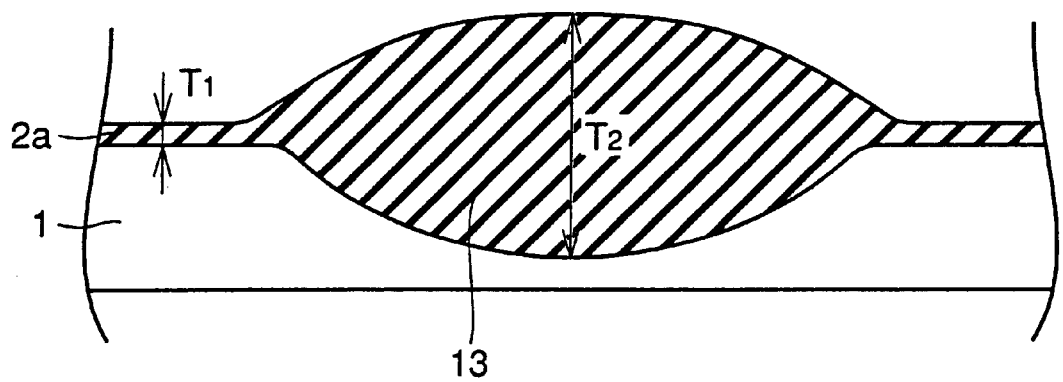
FIG. 7 is a cross section showing a state immediately after removal of the silicon oxide film and the silicon nitride film, in the method of manufacturing a semiconductor device in accordance with the first embodiment of the present invention.

Thereafter, referring to FIG. 6, planarizing thermal oxide film 12 is etched back until all wall surfaces of opening 20 in silicon nitride film 4 are exposed, and field oxide film 13 is formed, as shown in FIG. 6. Thereafter, silicon nitride film 4 and polycrystalline silicon film 3 are removed as shown in FIG. 7.

Figure 8:
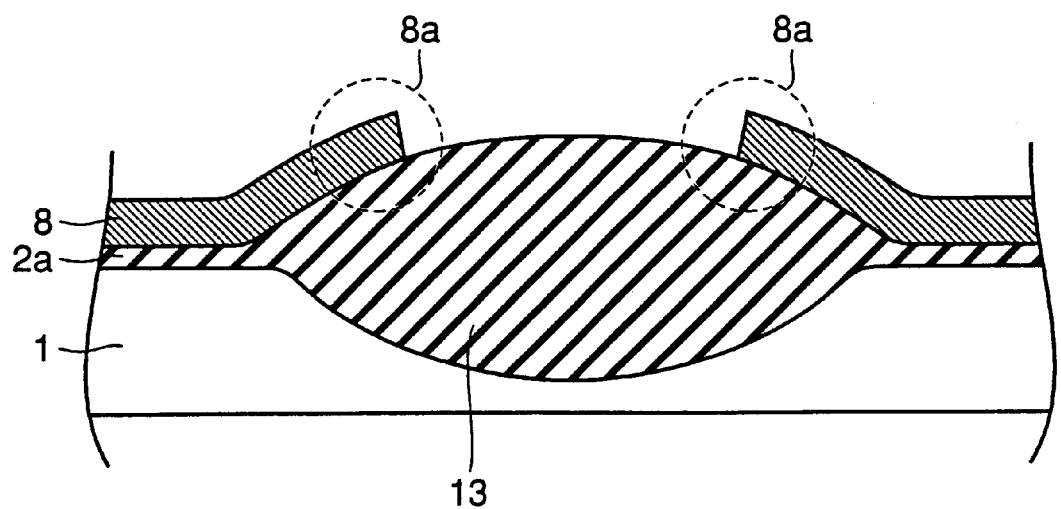
FIG. 8 is a cross section showing a state in which a conductive layer 8 is formed on field oxide film 13, in the method of manufacturing a semiconductor device in accordance with the first embodiment of the present invention.
Figure 9:
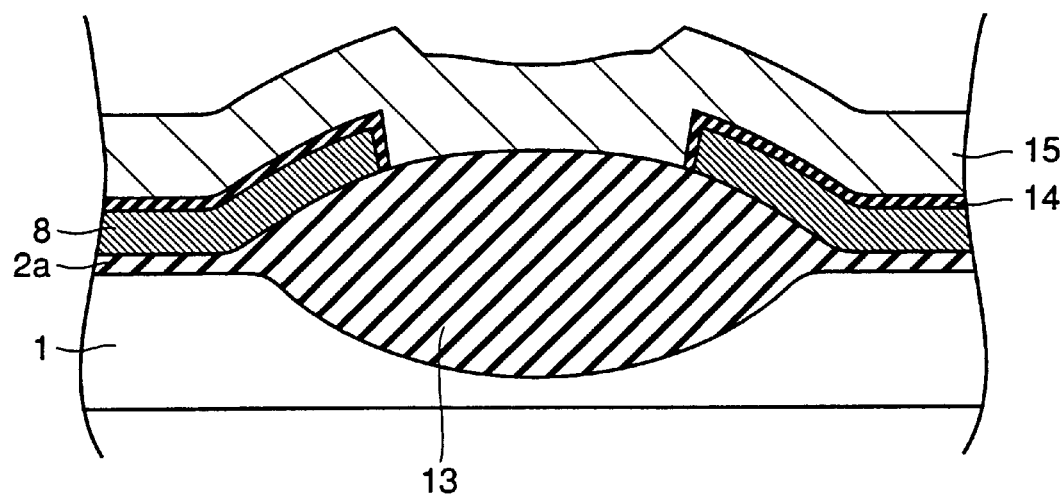
FIG. 9 is a cross section showing a state after formation of an ONO film 14 and a control gate electrode 15 to cover conductive layer 8 as a floating gate electrode, when the method of manufacturing the semiconductor device in accordance with the first embodiment of the present invention is applied to formation of a flash memory.
Figure 10:
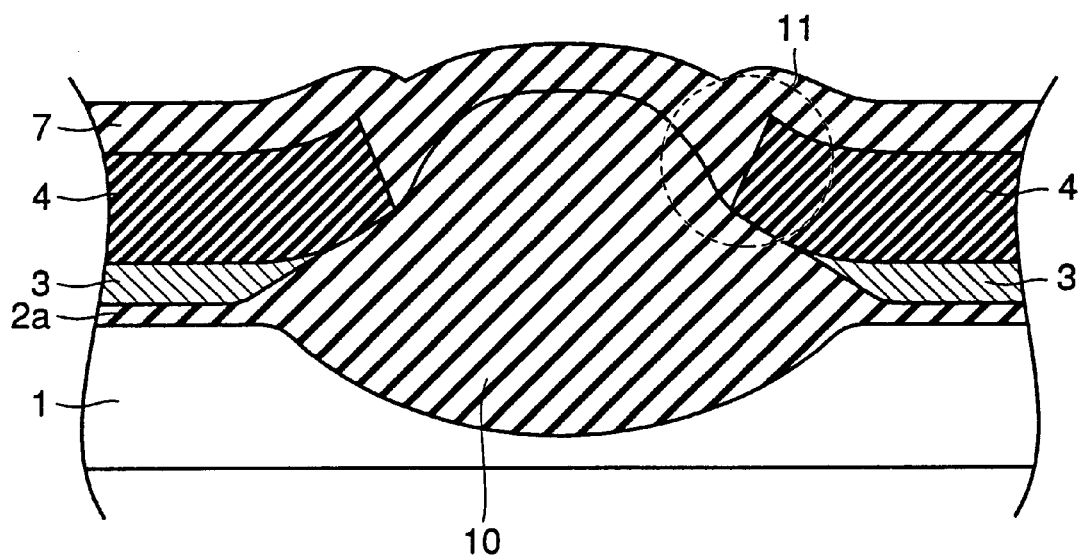
FIG. 10 is a cross section showing a state immediately after deposition of a planarizing oxide film 7 on field oxide film 13 in the method of manufacturing a semiconductor device in accordance with a second embodiment of the present invention.
Figure 11:
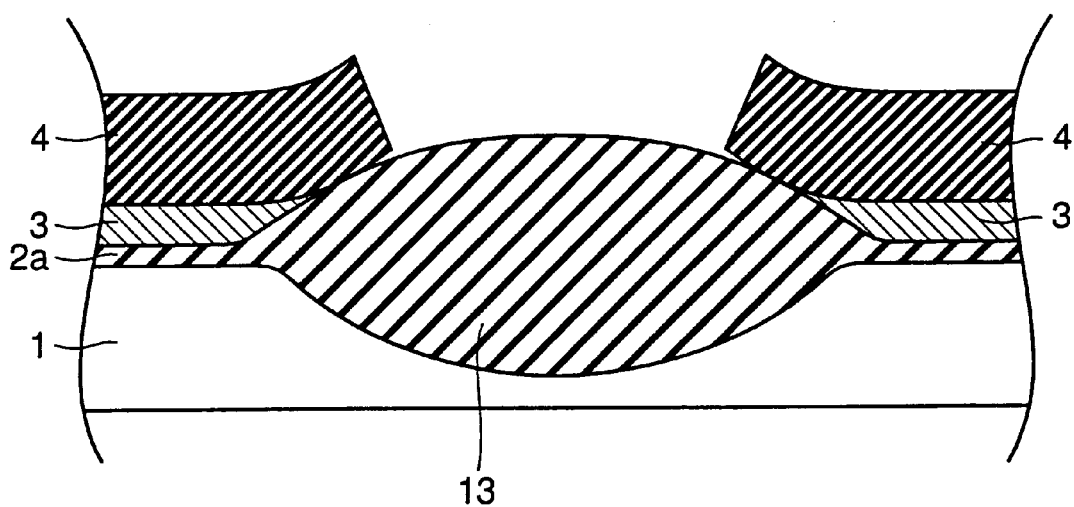
FIG. 11 is a cross section showing a state immediately after formation of field oxide film 13 by etching back planarizing oxide film 7 and thermal oxide film 12, in the method of manufacturing a semiconductor device in accordance with the second embodiment of the present invention.
Figure 12:
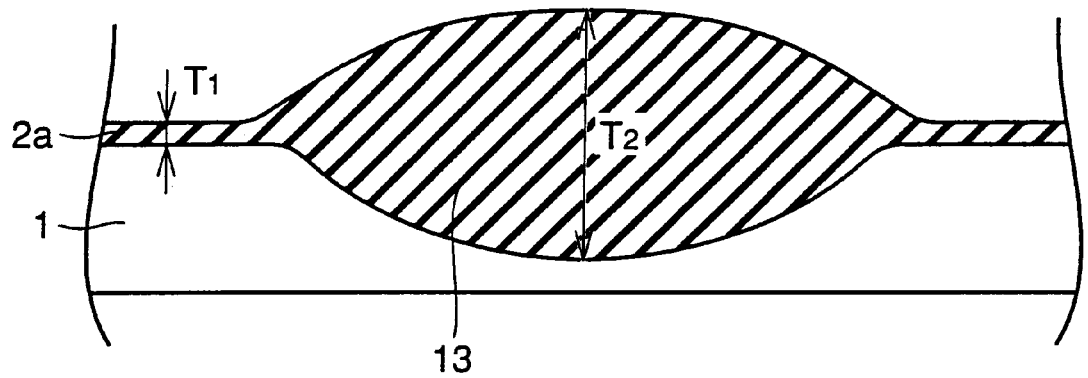
FIG. 12 is a cross section showing a state immediately, after removal of silicon oxide film 3 and silicon nitride film 4 in the method of manufacturing a semiconductor device in accordance with the second embodiment of the present invention.
Figure 20A:
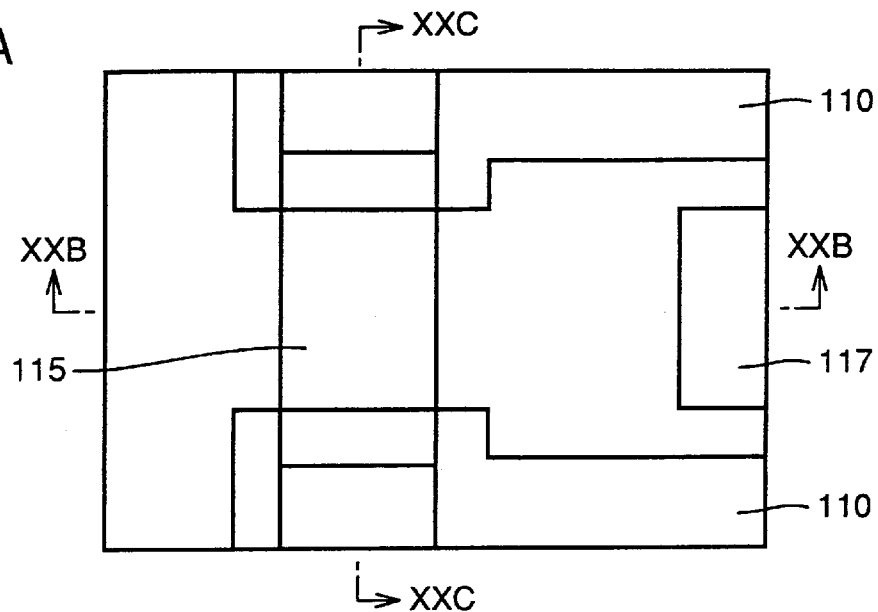
FIG. 20A is a plan layout showing a schematic structure of a flash memory to which the method of manufacturing a semiconductor device in accordance with the prior art and in accordance with embodiment of the present invention are applicable.
Figure 20B:
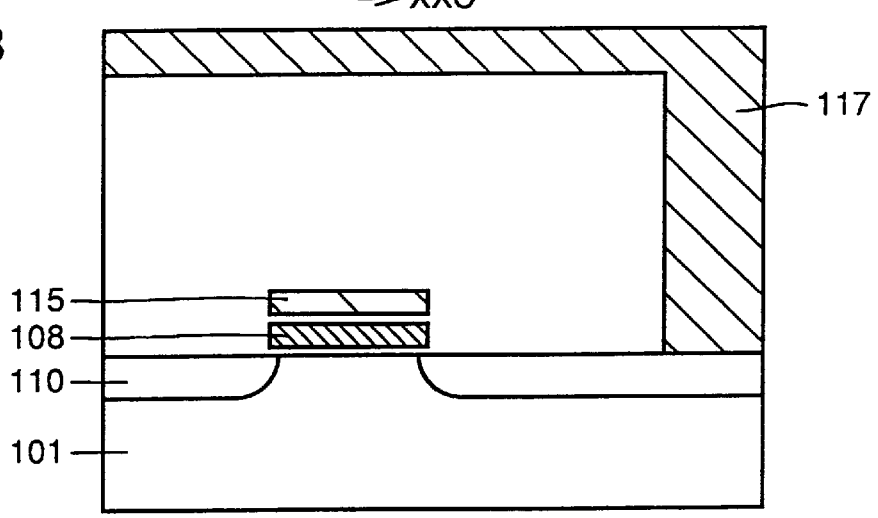
FIG. 20B is a cross section taken along the line XXB—XXB of FIG. 20A.
Figure 20C:
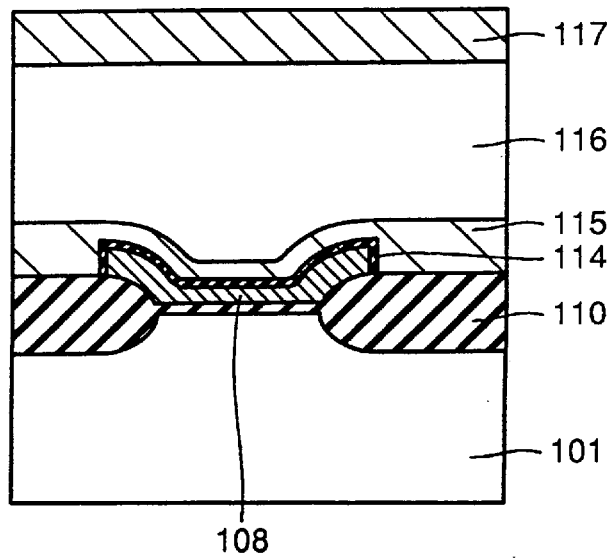
FIG. 20C is a cross section taken along the line XXC—XXC of FIG. 20A.

When a flash memory, for example, is to be formed on silicon substrate 1 including field oxide film 13 formed in this manner, a conductive layer 8 which will be the floating gate electrode is formed with end portions 8a positioned on field oxide film 13, as shown in FIG. 8. Thereafter, referring to FIG. 9, an ONO film 14 which will be an inter-electrode multi-layered insulating film is formed to cover the surface of conductive layer 108, and a conductive layer 15 which will be the control gate electrode is formed further thereon. Thereafter, an interlayer insulating film 116 and a bit line 117 are formed, and thus a memory cell for a flash memory similar to the structure shown in FIGS. 20A, 20B and 20C is completed.

In the semiconductor device formed through these steps, planarizing thermal oxide film 12 is provided as a silicon oxide film integrated as a whole, and hence etch selectivity thereof is almost uniform. Therefore, by setting etching condition such that selectivity of planarizing thermal oxide film 12 is higher than that of silicon nitride film 4, it becomes possible to etch and planarize the upheaved bird's head portion of planarizing thermal oxide film 12 while hardly removing silicon nitride film 4, even when etching is continued until lower end of silicon oxide film 4 is exposed in opening 20, after part of an upper surface of silicon nitride film is exposed. As a result, field oxide film 13 can be formed without a large upheaved bird's head in a semiconductor device having miniaturized element isolating regions.

Therefore, there is not a steep inclination between the bird's head and the bird's beak of field oxide film 13 formed through the above described steps. Therefore, when a flash memory shown in FIGS. 20A to 20C is to be formed, for example, steep rising of the end portion of the floating gate electrode positioned on field oxide film 13 is suppressed, and acute protrusion of the end portion is prevented. As a result, electric field concentration at the end portion is relaxed, preventing degraded charge retention characteristic caused by dielectric breakdown. The method of manufacturing in accordance with the present embodiment is effectively applicable to formation of a miniaturized flash memory, for example, having the memory cell width of at most 1.3 μm and separation width of at most 0.6 μm, to provide semiconductor devices having stable electrical characteristic.

SECOND EMBODIMENT

The method of manufacturing a semiconductor device in accordance with the second embodiment of the present invention will be described with reference to FIGS. 10 to 13.

In the method of manufacturing a semiconductor device in accordance with the second embodiment, steps similar to those shown in FIGS. 1 to 3 of the first embodiment are performed. Thereafter, referring to FIG. 10, a planarizing oxide film 7 is formed by the CVD method on silicon nitride film 4 and thermal oxide film 10, and the concave 11 generated between thermal oxide film 10 and silicon nitride film 4 is planarized. Thereafter, referring to FIG. 11, planarizing oxide film 7 and thermal oxide film 10 are etched back until all wall surfaces of opening 20 in silicon nitride film 40 are exposed, and field oxide film 12 is formed. Thereafter, referring to FIG. 12, silicon nitride film 4 and polycrystalline silicon film 3 are removed. In the present embodiment, CVD method is used in the step of forming planarizing oxide film 7. However, it is possible to provide planarizing oxide film 7 by other method, such as sputtering.

Figure 13:
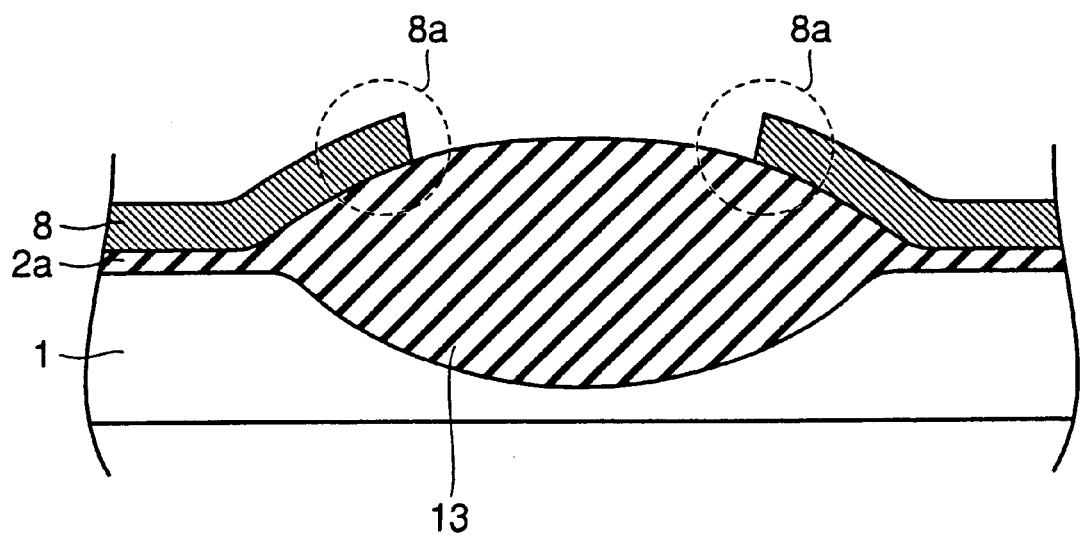
FIG. 13 is a cross section showing a state where conductive layer 8 is formed on field oxide film 13, in the method of manufacturing a semiconductor device in accordance with the second embodiment of the present invention.
Figure 14:
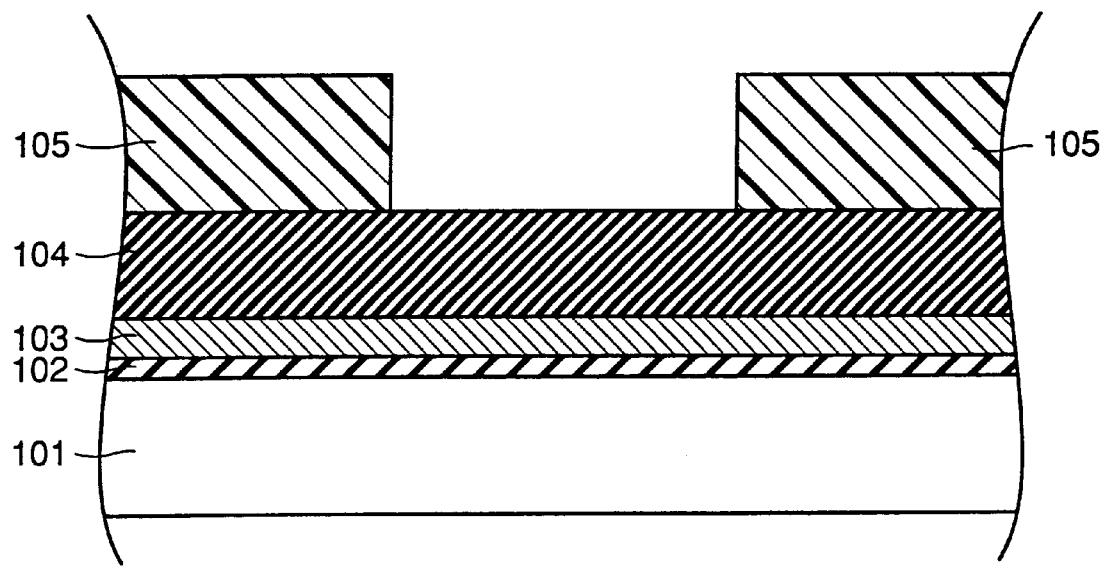
FIG. 14 is a cross section showing a state immediately after formation of a resist 105 having a prescribed pattern, in a conventional method of manufacturing a semiconductor device employing LOCOS method.
Figure 15:
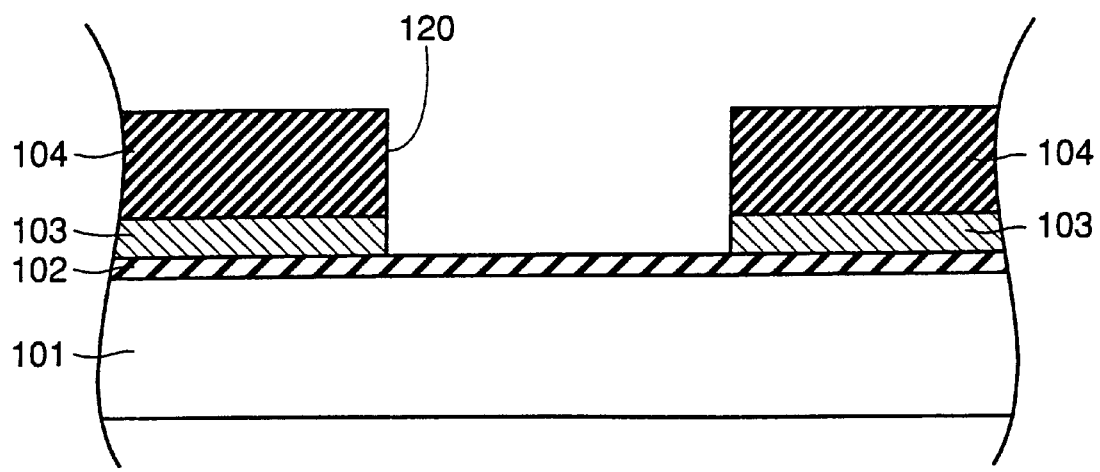
FIG. 15 is a cross section showing a state immediately after etching silicon oxide film 3 and silicon nitride film 4 in the conventional method of manufacturing a semiconductor device employing LOCOS method.
Figure 16:
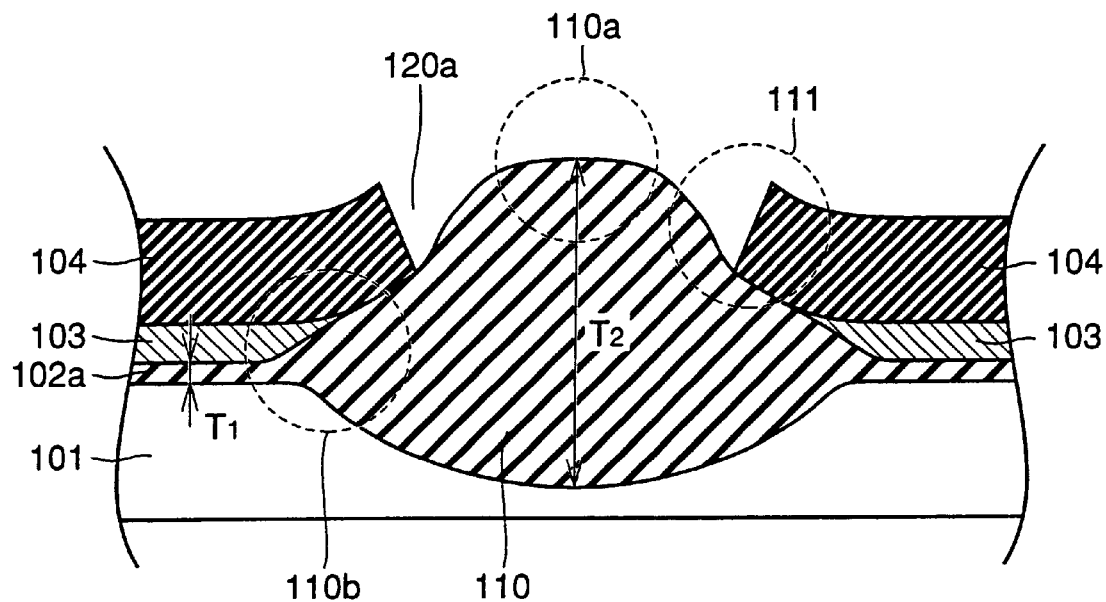
FIG. 16 is a cross section showing a state immediately after formation of thermal oxide film 110 by thermally oxidizing exposed silicon oxide film, in the conventional method of manufacturing a semiconductor device employing LOCOS method.
Figure 17:
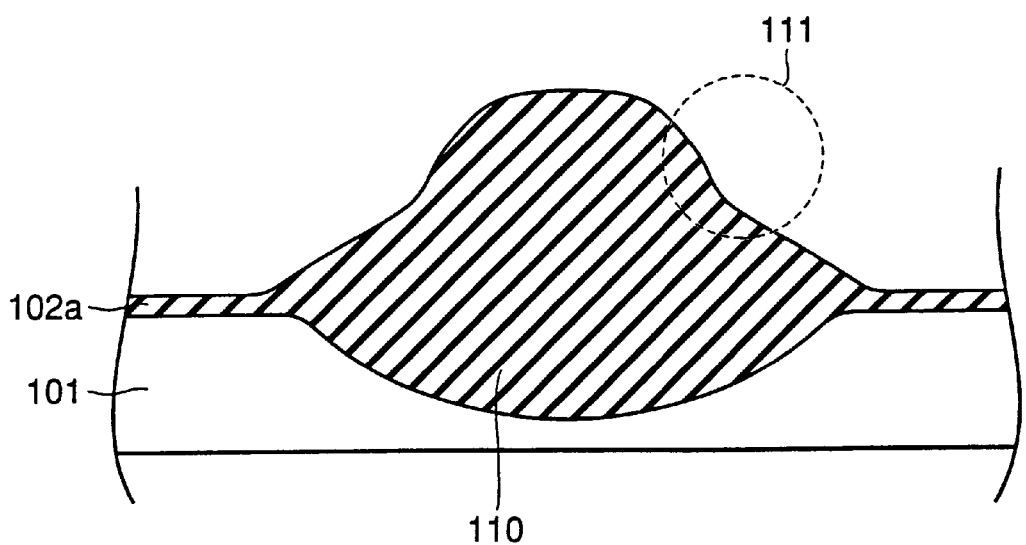
FIG. 17 is a cross section showing a state immediately after removal of silicon oxide film 103 and silicon nitride film 104, in the conventional method of manufacturing a semiconductor device employing LOCOS method.
Figure 18:
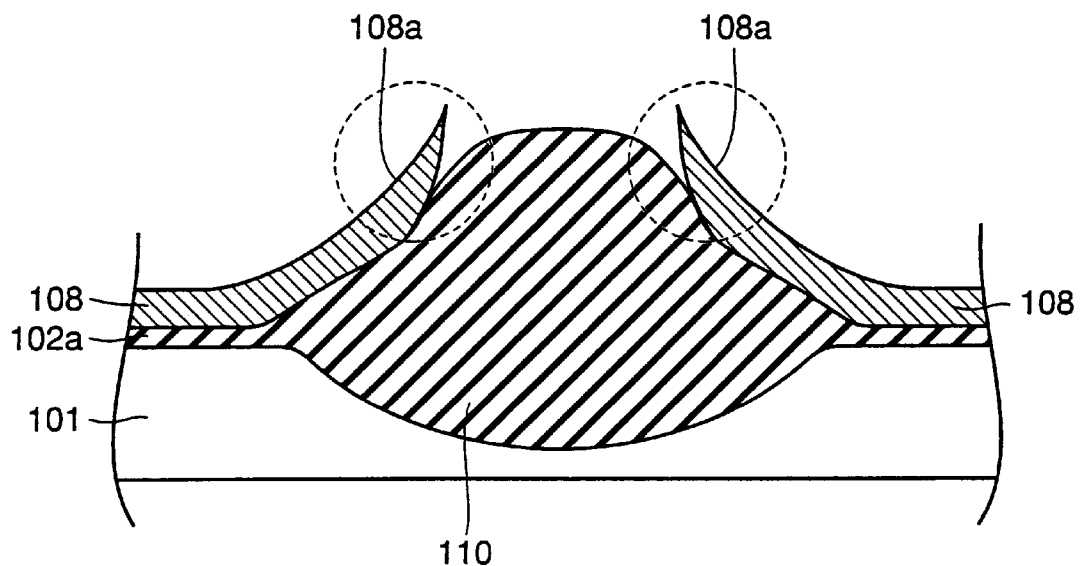
FIG. 18 is a cross section showing a state where conductive layer 108 is formed on field oxide film 110 in the conventional method of manufacturing a semiconductor device employing LOCOS method.
Figure 19:
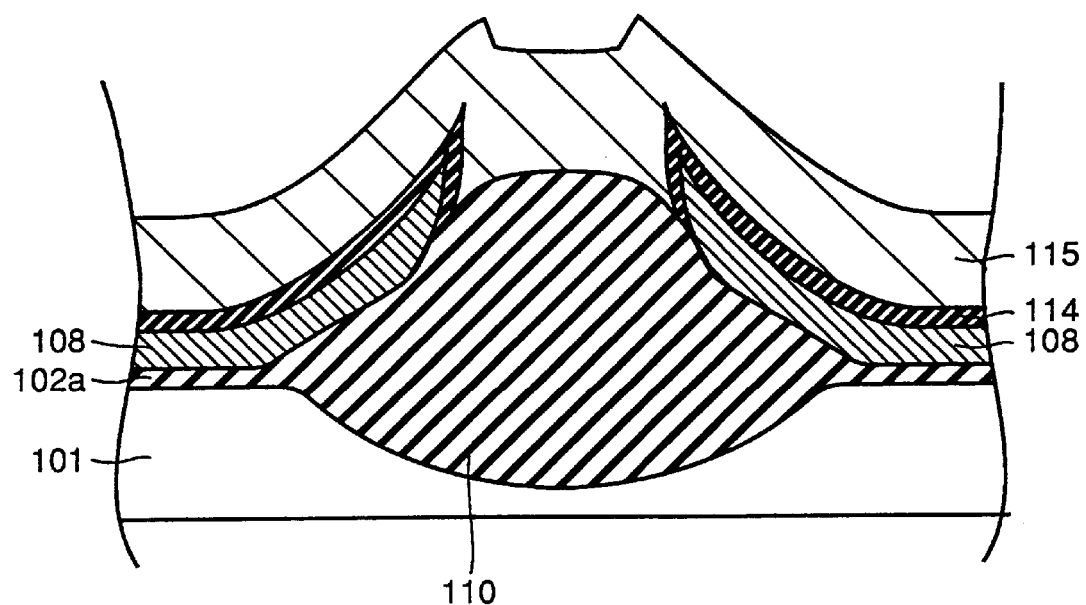
FIG. 19 is a cross section showing a state after formation of ONO film 114 and control gate electrode 115 to cover conductive layer 108 as a floating gate electrode, when the conventional method of manufacturing a semiconductor device employing LOCOS method is applied to formation of a flash memory.

When a flash memory, for example, is to be formed on silicon substrate 1 including field oxide film 13 formed in this manner, conductive layer 8 which will be the floating gate electrode is formed with end portions 8a positioned on field oxide film 13, as shown in FIG. 13. Thereafter, steps similar to those described with reference to FIG. 9 in the first embodiment are performed, and the memory cell of a flash memory similar to that shown in FIGS. 20A, 20B and 20C is completed.

By the method of manufacturing in accordance with the present invention, similar to the first embodiment, electric field concentration at the end portion of the floating gate electrode positioned on field oxide film 13 is relaxed when a flash memory shown in FIGS. 20A to 20C is formed, for example. Therefore, the method is effectively applicable to formation of a miniaturized flash memory having the memory cell width of at most 1.3 μm and separation width of at most 0.6 μm, to provide a semiconductor device having stable electrical characteristic.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the steps of:

forming a silicon oxide film on a silicon substrate;

forming a polycrystalline silicon film on said silicon oxide film;

forming a silicon nitride film on said polycrystalline silicon film;

forming a resist patterned to have an opening at a prescribed region on said silicon nitride film;

etching said polycrystalline silicon film and said silicon nitride film using said resist as a mask, to form an opening in said polycrystalline silicon film and said silicon nitride film at said prescribed region, and to expose said silicon oxide film at said prescribed region;

thermally oxidizing the exposed portion of said silicon oxide film to form an upheaved thermal oxide film at said prescribed region;

forming a planarizing silicon film of polycrystalline silicon or amorphous silicon on said silicon nitride film and said thermal oxide film to fill and planarize a concave portion generated between said thermal oxide film and said silicon nitride film;

thermally oxidizing said planarizing silicon film to form a planarizing thermal oxide film integral with said thermal oxide film;

etching back said planarizing thermal oxide film until all wall surfaces of said opening in said silicon nitride film are exposed, to form a field oxide film;

removing said silicon nitride film and said polycrystalline silicon film; and forming a conductive film having an end portion positioned on said field oxide film.

2. The method of manufacturing a semiconductor device according to claim 1, wherein condition for said etch back in said step of forming the field oxide film is set such that etch selectivity of the planarizing thermal oxide film is higher than that of silicon nitride film.

3. The method of manufacturing a semiconductor device according to claim 1, wherein the conductive layer formed in the step of forming the conductive layer provides a floating gate electrode of a flash memory, said method further comprising the steps of covering a surface of said conductive layer by an ONO film, and forming a conductive layer to be a control gate electrode, on said ONO film.

4. The method of manufacturing a semiconductor device according to claim 1, applied to formation of a semiconductor memory device having a memory cell width of at most 1.3 μm and separation width of at most 0.6 μm.

5. A method of manufacturing a semiconductor device, comprising the steps of:

forming a silicon oxide film on a silicon substrate;

forming a polycrystalline silicon film on said silicon oxide film;

forming a silicon nitride film on said polycrystalline silicon film;

forming a resist patterned to have an opening at a prescribed region on said silicon nitride film;

etching said polycrystalline silicon film and said silicon nitride film using said resist as a mask, to form an opening in said polycrystalline silicon film and said silicon nitride film at said prescribed region, and to expose said silicon oxide film at said prescribed region;

thermally oxidizing the exposed portion of said silicon oxide film, to form an upheaved thermal oxide film at said prescribed region;

depositing a planarizing oxide film on said silicon nitride film and said thermal oxide film to fill and planarize a concave generated between said silicon nitride film and said thermal oxide film;

etching back said planarizing oxide film and said thermal oxide film until all wall surfaces of said opening in said silicon nitride film are exposed, to form a field 25 oxide film; and removing said silicon nitride film and said polycrystalline silicon film, and forming a conductive layer having an end portion positioned on said field oxide film.

6. The method of manufacturing a semiconductor device according to claim 5, wherein said step of forming said planarizing oxide film includes the step of depositing an oxide film by CVD method.

7. The method of manufacturing a semiconductor device according to claim 5, wherein said step of forming said planarizing film includes the step of depositing an oxide film by sputtering.

8. The method of manufacturing a semiconductor device according to claim 5, wherein condition of said etch back in said step of forming a field oxide film is set such that selectivity of planarizing oxide film is made higher than that of the silicon nitride film.

9. The method of manufacturing a semiconductor device according to claim 5, wherein the conductive layer formed by said step of forming the conductive layer provides a floating gate of a flash memory, said method further comprising, after said step of forming the conductive layer, the steps of covering a surface of said conductive layer by an ONO film, and forming a conductive layer to be a control gate electrode, on said ONO film.

10. The method of manufacturing a semiconductor device according to claim 5, applied to formation of a semiconductor memory device having a memory cell width of at most 1.3 $\mu$m and separation width of at most 0.6 $\mu$m.

* * * * *